United States Patent
Habuka et al.

(10) Patent No.: US 11,072,857 B2
(45) Date of Patent: Jul. 27, 2021

(54) VANADIUM SILICON NITRIDE FILM, MEMBER COATED WITH VANADIUM SILICON NITRIDE FILM AND METHOD FOR MANUFACTURING THE SAME

(71) Applicant: DOWA THERMOTECH CO., LTD., Tokyo (JP)

(72) Inventors: Satoru Habuka, Aichi (JP); Hiroyuki Matsuoka, Aichi (JP); Wataru Sakakibara, Aichi (JP)

(73) Assignee: DOWA THERMOTECH CO., LTD., Tokyo (JP)

( * ) Notice: Subject to any disclaimer, the term of this patent is extended or adjusted under 35 U.S.C. 154(b) by 130 days.

(21) Appl. No.: 16/465,755

(22) PCT Filed: Dec. 28, 2017

(86) PCT No.: PCT/JP2017/047249
§ 371 (c)(1),
(2) Date: May 31, 2019

(87) PCT Pub. No.: WO2018/124279
PCT Pub. Date: Jul. 5, 2018

(65) Prior Publication Data
US 2019/0390331 A1    Dec. 26, 2019

(30) Foreign Application Priority Data
Dec. 28, 2016 (JP) .............................. JP2016-255179

(51) Int. Cl.
| | | |
|---|---|---|
| C23C 16/34 | (2006.01) |
| C23C 16/513 | (2006.01) |
| C04B 35/58 | (2006.01) |
| C03C 17/22 | (2006.01) |
| B21D 37/20 | (2006.01) |
| B21J 13/02 | (2006.01) |

(52) U.S. Cl.
CPC .......... *C23C 16/345* (2013.01); *C03C 17/225* (2013.01); *C04B 35/58* (2013.01); *C23C 16/513* (2013.01); *B21D 37/20* (2013.01); *B21J 13/02* (2013.01)

(58) Field of Classification Search
CPC ....... C23C 16/345; C23C 16/513; B21J 13/02
USPC ......................................................... 428/698
See application file for complete search history.

(56) References Cited

FOREIGN PATENT DOCUMENTS

| | | |
|---|---|---|
| JP | 2002-371352 | 12/2002 |
| JP | 2005-46975 | 2/2005 |
| JP | 2006-93550 | 4/2006 |
| WO | 2016/171273 | 10/2016 |

OTHER PUBLICATIONS

Maeda, Masakatsu, et al., "Solid State Diffusion Bonding of Silicon Nitride Using Vanadium Foils ". Materials Transactions, vol. 44, No. 12, (2003) pp. 2701-2710.*
Zhao et al., Materials Characterization, 117, 65-75, 2016. (Year: 2016).*
Zhao Hongjian et al., "Structure and properties of Si-implanted VN coatings prepared by RF magnetron sputtering", Materials Characterization, 2016, vol. 117, pp. 65-75.
International Search Report issued in International Patent Application No. PCT/JP2017/047249, dated Mar. 6, 2018.

* cited by examiner

*Primary Examiner* — Hui H Chin
(74) *Attorney, Agent, or Firm* — Greenblum & Bernstein, P.L.C.

(57) ABSTRACT

A vanadium silicon nitride film formed as a hard film to a base material satisfies $0.30 \leq a/b \leq 1.7$ and $0.24 \leq b \leq 0.36$ when a=vanadium element concentration [at %]/(vanadium element concentration [at %]+silicon element concentration [at %]+nitrogen element concentration [at %]) and b=silicon element concentration [at %]/(vanadium element concentration [at %]+silicon element concentration [at %]+nitrogen element concentration [at %]), and has a hardness of 2300 HV or more.

8 Claims, 2 Drawing Sheets

US 11,072,857 B2

VANADIUM SILICON NITRIDE FILM, MEMBER COATED WITH VANADIUM SILICON NITRIDE FILM AND METHOD FOR MANUFACTURING THE SAME

TECHNICAL FIELD

The present invention relates to a vanadium silicon nitride film formed as a hard film, a coated member which is coated with the vanadium silicon nitride film, and a method for manufacturing the same.

BACKGROUND ART

On surfaces of a die for press forming, a cutting tool, a gear cutting tool, a casting tool and so on, there have been conventionally formed vanadium-based coating films such as a vanadium nitride film (VN film), a vanadium carbide film (VC film) and a vanadium carbonitride film (VCN film) which have a high film hardness and a good lubricity as hard films.

Patent Document 1 describes a method for forming a vanadium nitride film, a vanadium carbide film and a vanadium carbonitride film by an ion plating method as a conventional film formation method of the vanadium-based coating film. Further, Patent Document 2 also describes a method for forming a vanadium nitride film by the ion plating method.

However, the vanadium-based coating film represented by the vanadium nitride film, the vanadium carbide film and the vanadium carbonitride film is excellent in sliding characteristic but is inferior in oxidation resistance, thus bringing about a problem that oxidation of the film causes a decrease in hardness. On the other hand, in a titanium-based coting film being one kind of a hard film, a different element such as silicon (Si) is contained in order to improve oxidation resistance. Similarly to the above, Non-patent Document 1 discloses formation of a vanadium silicon nitride film (VSiN film) by making a vanadium-based coating film contain silicon.

PRIOR ART DOCUMENT

Patent Document

[Patent Document 1] Japanese Laid-open Patent Publication No. 2002-371352
[Patent Document 2] Japanese Laid-open Patent Publication No. 2005-46975

Non-Patent Document

Non-patent Document 1: Hongjian Zhao, and three others, "Structure and properties of Si-implanted VN coatings prepared by RF magnetron sputtering", Materials Characterization, ELSEVIER, Apr. 27, 2016, Volume 117 (2016), p. 65-75

SUMMARY OF THE INVENTION

Problems to be Solved by the Invention

Non-patent Document 1 discloses an example in which 0 to 19.8 at % silicon is contained in a film, and FIG. 8 of Non-patent Document 1 illustrates observation that a film hardness is decreased when a content of silicon is over 10.2 at %. In other words, conventionally, for fear of decrease in film hardness, which is an important characteristic as a hard film, it has not been possible to make a film contain sufficient silicon for the sake of improvement of oxidation resistance.

The present invention is made in view of the above-described circumstances and its object is to improve oxidation resistance while securing a sufficient hardness of a vanadium silicon nitride film.

Further, in order to make the film contain more silicon by using magnetron sputtering as in Non-patent Document 1, it is required to increase sputtering output to a silicon target, which may increase a size of a device. However, since silicon is a semiconductor, an amount of silicon particles supplied by sputtering is limited, and hence it is difficult to make a film contain more silicon for the sake of improvement of oxidation resistance. Besides, since a film formation processing using magnetron sputtering is poor in throwing power of evaporating particles, a film formation apparatus requires measures such as provision of a rotation mechanism at a work table in the film formation processing on a complicated shape article such as a mold. Therefore, in the conventional film formation method, it is necessary to prepare a film formation apparatus of special specifications for the film formation of the complicated shape article, bringing about a problem of an increase in cost accompanying introduction of the film formation apparatus.

A method for manufacturing a member coated with a vanadium nitride film according to the present invention is made in consideration of the aforementioned circumstances, and an object thereof is to secure a sufficient hardness of the vanadium silicon nitride film and to improve oxidation resistance, and in addition, to suppress a cost accompanying introduction of the film formation apparatus.

Means for Solving the Problems

The present invention to solve the above-described problems is a vanadium silicon nitride film formed as a hard film to a base material, wherein the vanadium silicon nitride film satisfies $0.30 \leq a/b \leq 1.7$ and $0.24 \leq b \leq 0.36$ when a=vanadium element concentration [at %]/(vanadium element concentration [at %]+silicon element concentration [at %]+nitrogen element concentration [at %]) and b=silicon element concentration [at %]/(vanadium element concentration [at %]+silicon element concentration [at %]+nitrogen element concentration [at %]), and has a hardness of 2300 HV or more.

The present invention from another point of view is a member coated with a vanadium silicon nitride film in which a base material is coated with the vanadium silicon nitride film, wherein the vanadium silicon nitride film satisfies $0.30 \leq a/b \leq 1.7$ and $0.24 \leq b \leq 0.36$ when a=vanadium element concentration [at %]/(vanadium element concentration [at %]+silicon element concentration [at %]+nitrogen element concentration [at %]) and b=silicon element concentration [at %]/(vanadium element concentration [at %]+silicon element concentration [at %]+nitrogen element concentration [at %]), and has a hardness of 2300 HV or more.

Further, the present invention from another point of view is a method for manufacturing a member coated with a vanadium silicon nitride film in which a base material is coated with the vanadium silicon nitride film, the method including: in forming the vanadium silicon nitride film, supplying a raw material gas containing a nitrogen source gas constituted with one or more gases selected from a group of a nitrogen gas and an ammonia gas, a vanadium chloride gas, a silane source gas constituted with one or more gases selected from a group of a silicon tetrachloride gas, a silane trichloride gas, a silane dichloride gas, a silane chloride gas, silane and silicon tetrafluoride, and a hydrogen gas; and performing plasma chemical vapor deposition to form the vanadium silicon nitride film which satisfies $0.30 \leq a/b \leq 1.7$ and $0.24 \leq b \leq 0.36$ when a=vanadium element concentration [at %]/(vanadium element concentration [at %]+silicon element concentration [at %/]+nitrogen element concentration [at %]) and b=silicon element concentration [at %]/(vanadium element concentration [at %]+silicon element concentration [at %]+nitrogen element concentration [at %]).

Further, the present invention from another point of view is a method for manufacturing a member coated with a vanadium silicon nitride film in which a base material is coated with the vanadium silicon nitride film, the method including: in forming the vanadium silicon nitride film by plasma chemical vapor deposition, supplying a hydrogen gas, a nitrogen gas, a vanadium chloride gas, a silane source gas and an argon gas; and setting a ratio of partial pressures of the hydrogen gas, the nitrogen gas, the vanadium chloride gas, the silane source gas and the argon gas to $\{100\}:\{(61.25-0.875 \times x) \text{ to } (86.25-0.875 \times x)\}:\{(0.25+0.025 \times x) \text{ to } (3.25+0.025 \times x)\}:\{(3.5-0.04 \times x) \text{ to } (6.2-0.04 \times x)\}:\{(0.5 \text{ to } 15)\}$, when a Duty ratio is indicated as x ($10 \leq x \leq 65$), to form the vanadium silicon nitride film.

The "vanadium silicon nitride film" according to the present invention is a film in which a total of a vanadium element concentration, a silicon element concentration and a nitrogen element concentration is 90 at % or more.

Effect of the Invention

According to the present invention, oxidation resistance of a vanadium silicon nitride film can be improved while a sufficient hardness thereof is secured.

MODES FOR CARRYING OUT INVENTION

Hereinafter, an embodiment of the present invention will be explained with reference to the drawings. Note that in this specification and the drawings, the same codes are given to components having substantially the same functional configurations to omit duplicated explanation.

In this embodiment, a plasma chemical vapor deposition method (what is called a plasma CVD method) is used to form a vanadium silicon nitride film to a base material, to thereby produce a member coated with the vanadium silicon nitride film. When a=vanadium element concentration [at %]/(vanadium element concentration [at %]+silicon element concentration [at %]+nitrogen element concentration [at %]) and b=silicon element concentration [at %]/(vanadium element concentration [at %]+silicon element concentration [at %]+nitrogen element concentration [at %]), the vanadium silicon nitride film satisfies $0.30 \leq a/b \leq 1.7$ and $0.24 \leq b \leq 0.36$, and has a hardness of 2300 HV or more. Note that though die steel such as SKD11, for example, other tool steel or the like is used as the base material, the base material is not limited to these materials. Any material may be adopted as the base material as long as it requires a hard film treatment in accordance with strength inherent to the material and usage and so on.

Figure 1:
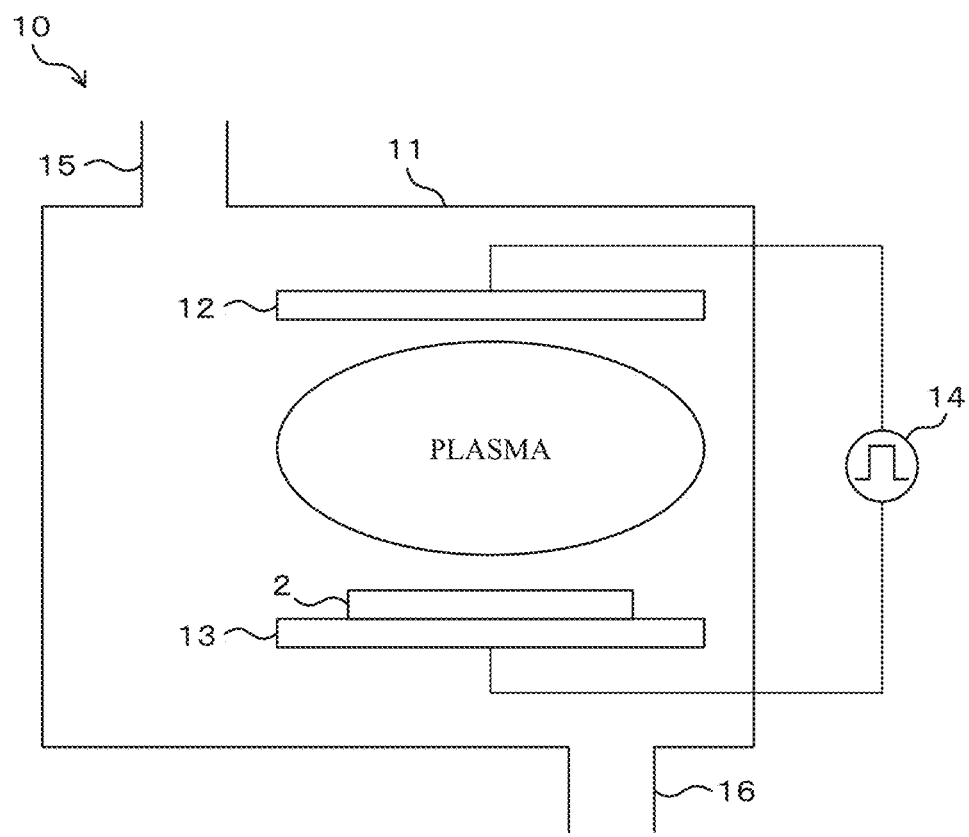
FIG. 1 A schematic view illustrating a configuration of a film formation apparatus for a vanadium silicon nitride film according to an embodiment of the present invention.

In this embodiment, as a film formation apparatus for forming a vanadium silicon nitride film, a plasma processing apparatus 10 as illustrated in FIG. 1 is used. The plasma processing apparatus 10 includes a chamber 11 into which a base material 2 is carried, an anode 12 and a cathode 13, and a pulse power supply 14. A gas supply pipe 15 from which a raw material gas is supplied is connected to an upper part of the chamber 11, and a gas exhaust pipe 16 which exhausts a gas in the chamber is connected to a lower part of the chamber 11. On a downstream side of the gas exhaust pipe 16, a vacuum pump (not illustrated) is provided. The cathode 13 also has a role as a support table which supports the base material 2, and the base material 2 carried into the chamber is mounted on the cathode. Further, inside the chamber 11, a heater (not illustrated) is provided, so that the heater adjusts an atmospheric temperature in the chamber and thereby adjusts a temperature of the base material 2.

Note that a configuration of the plasma processing apparatus 10 is not limited to the one explained in this embodiment. For example, a high-frequency power supply may be used in place of the pulse power supply 14, or a shower head which supplies the raw material gas may be provided and used as the anode 12. Further, the base material 2 may be heated only with glow current without the heater being provided. In short, the plasma processing apparatus 10 only needs to have a structure capable of converting the raw material gas supplied in the chamber into plasma and form the vanadium silicon nitride film on the base material 2 so as to manufacture a member coated with a vanadium silicon nitride film.

Figure 2:
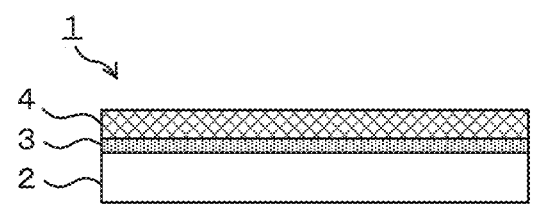
FIG. 2 A view illustrating a member coated with a vanadium silicon nitride film according to an embodiment of the present invention.

Next, a method for manufacturing a member coated with a vanadium silicon nitride film will be explained. In this embodiment, as illustrated in FIG. 2, after a vanadium nitride film 3 is formed on a surface of the base material 2, a vanadium silicon nitride film 4 is formed on a surface of the vanadium nitride film 3.

<Film Formation Processing Preparation>

First of all, the base material 2 is carried into the chamber 11 and the base material 2 is set at a predetermined position. Thereafter, evacuation is performed so that a pressure in the chamber becomes, for example, 10 Pa or less. In this event, a temperature in the chamber is about a room temperature. Subsequently, the heater is operated to perform a baking treatment of the base material 2. Thereafter, the heater is turned off once, and the plasma processing apparatus 10 is let stand for a predetermined time.

<Heating Step>

Next, a small amount of hydrogen gas is supplied into the chamber, and the heater is operated again. At this heating step, the temperature of the base material 2 is raised up to near a plasma processing temperature. The pressure in the chamber is maintained, for example, at about 100 Pa.

<Plasma Processing Step>

Subsequently, film formation processing of the vanadium nitride film 3 using the plasma CVD method is performed. In this embodiment, the hydrogen gas is converted into plasma prior to the film formation processing of the vanadium nitride film 3. Specifically, the pulse power supply 14 is operated in a state where the hydrogen gas supplied at the heating step is continuously supplied. Thereby, hydrogen gas is converted into plasma between electrodes. Hydrogen radicals generated in this manner reduce an oxidation film on the surface of the base material and clean the surface of the base material before the film formation. Note that a voltage, a frequency, a Duty ratio and so on of the pulse power supply 14 are appropriately set so as to convert the gas supplied in the chamber into plasma.

After converting the hydrogen gas into plasma, a nitrogen gas and an argon gas are further supplied into the chamber into which the hydrogen gas is being supplied. This generates plasma of the hydrogen gas, the nitrogen gas, and the argon gas and thereby can stabilize glow discharge before the formation of the vanadium nitride film 3.

Thereafter, as a vanadium source gas, a vanadium chloride gas is further supplied into the chamber. This makes a state where the hydrogen gas, the nitrogen gas, the vanadium chloride gas, and the argon gas are supplied into the chamber as a raw material gas for forming the vanadium nitride film 3. A ratio of partial pressures of the hydrogen gas, the nitrogen gas, the vanadium chloride gas and the argon gas is set, for example, to (35 to 50):(9 to 10):(0.9 to 1.2):(0.5 to 5). The pressure in the chamber is set, for example, to 50 Pa or more and 200 Pa or less.

Note that, for example, a vanadium tetrachloride ($VCl_4$) gas or a vanadium trichloride oxide ($VOCl_3$) gas is used as the vanadium chloride gas. It is preferable to use the vanadium tetrachloride gas because the number of elements constituting the gas is smaller and removal of impurities in the vanadium nitride film becomes easier. Further, the vanadium tetrachloride gas is preferable also in terms of being easily available, being liquid at a room temperature, and being easy supply as a gas. Further, the nitrogen source gas is not limited to the nitrogen gas and can be, for example, an ammonia gas. Further, the nitrogen gas and the ammonia gas may be mixed and supplied as the nitrogen source gas.

When the vanadium chloride gas is supplied into the chamber, the vanadium chloride gas is converted into plasma between the electrodes. The vanadium gas and the nitrogen gas converted into plasma between the electrodes adhere to the base material 2, whereby the vanadium nitride film 3 is formed on the surface of the base material 2. Note that the atmospheric temperature in the chamber in the film formation processing of the vanadium nitride film 3 is preferably 450° C. or higher and 550° C. or lower. A voltage in the film formation processing is preferably 700 V or higher and 1500 V or lower.

Figure 3:
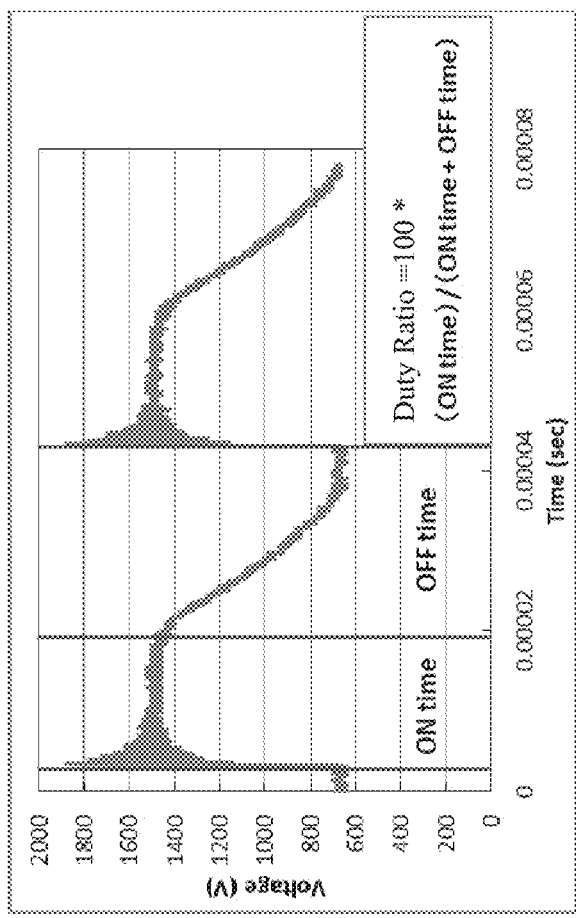
FIG. 3 A view for explaining a definition of a Duty ratio.

After the vanadium nitride film 3 is formed on the surface of the base material 2, a silane source gas is further supplied into the chamber. In this event, when a Duty ratio is x ($10 \leq x \leq 65$), a ratio of partial pressures of the hydrogen gas, the nitrogen gas, the vanadium chloride gas, the silane source gas and the argon gas is set, for example, to $\{100\}$:$\{(61.25-0.875 \times x)$ to $(86.25-0.875 \times x)\}$:$\{(0.25+0.025 \times x)$ to $(3.25+0.025 \times x)\}$:$\{(3.5-0.04 \times x)$ to $(6.2-0.04 \times x)\}$:$\{(0.5$ to $5)\}$, or set to $\{100\}$:$\{(61.25-0.875 \times x)$ to $(86.25-0.875 \times x)\}$:$\{(0.25+0.025 \times x)$ to $(3.25+0.025 \times x)\}$: $\{(3.5-0.04 \times x)$ to $(6.2-0.04 \times x)\}$:$\{(0.5$ to $15)\}$. The pressure in the chamber is set to, for example, 50 Pa or more and 200 Pa or less. Note that the Duty ratio, being defined by a voltage application time per cycle as illustrated in FIG. 3, is calculated as Duty ratio=100×application time (ON time)/{application time (ON time)+application suspension time (OFF time)}.

Note that as the silane source gas, there is used a silane-based gas such as, for example, a silicon tetrachloride gas, a silane trichloride gas, a silane dichloride gas, a silane chloride gas, silane or silicon tetrafluoride. The gas exemplified here may be provided independently or one or more gases may be mixed and provided. Further, among the above gases, it is preferable to use the silicon tetrachloride ($SiCl_4$) gas from which chlorine atoms can be easily removed by hydrogen plasma and which is thermally stable and decomposed only in plasma.

Further, since the partial pressure of the silane source gas influences an increase and a decrease in silicon amount in the vanadium silicon nitride film, the partial pressure of the silane source gas may be adjusted if it is desired to change the silicon amount in the vanadium silicon nitride film. Since the partial pressure of the vanadium chloride gas and the partial pressure of the hydrogen gas influence an increase and a decrease in vanadium amount in the vanadium silicon nitride film, at least either one of the partial pressure of the vanadium chloride gas and the partial pressure of the hydrogen gas may be adjusted if it is desired to change the vanadium amount in the vanadium silicon nitride film. Since the partial pressure of the nitrogen source gas influences an increase and a decrease in nitrogen amount in the vanadium silicon nitride film, the partial pressure of the nitrogen source gas may be adjusted if it is desired to change the nitrogen amount in the vanadium silicon nitride film.

A voltage in the film formation processing of the vanadium silicon nitride film 4 is preferably 700 V or higher and 1800 V or lower. Besides, since a glow current value in the plasma processing influences an increase and a decrease in silicon amount and nitrogen amount in the vanadium silicon nitride film, the glow current value may be adjusted if it is desired to change the silicon amount and the nitrogen amount in the vanadium silicon nitride film. Further, the atmospheric temperature in the chamber in the film formation processing of the vanadium silicon nitride film 4 is preferably 450° C. or higher and 550° C. or lower. Since the atmospheric temperature may become a cause to influence a vanadium amount in the vanadium silicon nitride film, the atmospheric temperature may be adjusted as a method to adjust the vanadium amount in the vanadium silicon nitride film. Increasing the atmospheric temperature in the chamber can increase the vanadium amount in the vanadium silicon nitride film.

Supplying the silane source gas into the chamber converts the silane source gas into plasma between the electrodes, whereby silicon adheres to the surface of the vanadium nitride film 3, together with vanadium and nitrogen having already been converted into plasma. Consequently, the vanadium silicon nitride film 4 is formed on the surface of the vanadium nitride film 3, so that the member coated with the vanadium silicon nitride film 1 can be obtained.

Further, when a/b is less than 0.30 or over 1.7, a sufficient hardness of the vanadium silicon nitride film 4 cannot be obtained. A preferable lower limit value of a/b is 0.4, and a more preferable lower limit value of a/b is 0.8. A preferable upper limit value of a/b is 1.5, and a more preferable upper limit value is 1.3.

Besides, when b is less than 0.24, a silicon amount to contribute to oxidation resistance is too small to improve oxidation resistance of the vanadium silicon nitride film 4 sufficiently. On the other hand, when b is over 0.36, at least a content of either one of vanadium and nitrogen becomes comparatively smaller, resulting in a decrease in slidability that the vanadium silicon nitride film 4 has or a decrease in hardness.

The vanadium silicon nitride film 4 obtained in this embodiment has a hardness of 2300 or more in Vickers hardness HV, that is, has a hardness equivalent to or higher than that of a conventional vanadium nitride film. In addition, oxidation resistance of the film is improved due to the fact that the film contains a larger amount of silicon than the conventional one. Accordingly, the member coated with the vanadium silicon nitride film 1 according to this embodiment is a member achieving both the hardness and the oxidation resistance at higher levels than the conventional one.

Further, the vanadium silicon nitride film 4 obtained in this embodiment is a film whose complex elastic modulus is 300 GPa or less. Normally, the hardness and the complex elastic modulus are in a proportional relation, and the complex elastic modulus generally increases with an increase in hardness. However, the vanadium silicon nitride film 4 in this embodiment has a complex elastic modulus suppressed to 300 GPa or less though a Vickers hardness HV reaches 2300 or more. This is a low complex elastic modulus even compared with a hard film having the same level of hardness and means that an elastically deformed region is wide. In other words, the vanadium silicon nitride film 4 in this embodiment has high abrasion resistance compared with the hard film having the same level of hardness. Accordingly, the member coated with the vanadium silicon nitride film 1 in this embodiment which is coated with such a vanadium silicon nitride film 4 is a member achieving both the hardness and the complex elastic modulus at high levels and has more excellent abrasion resistance than the conventional hard film. Note that in the case where a/b is in a range of 0.5 to 1.55, both the hardness of 2500 HV or more and the complex elastic modulus of 250 GPa or less can be achieved.

Here, as an index to evaluate whether or not both the hardness and the complex elastic modulus of the vanadium silicon nitride film 4 are achieved, "Vickers hardness (HV)/complex elastic modulus (GPa)" being a ratio of a hardness to a complex elastic modulus is used. A hard film whose value of Vickers hardness (HV)/complex elastic modulus (GPa) is 10 or more is a film which achieves both the hardness and the complex elastic modulus. Therefore, the value of Vickers hardness (HV)/complex elastic modulus of the vanadium silicon nitride film 4 is preferable to be 10 or more. In a vanadium silicon nitride film 4 as that in this embodiment, when a value of Vickers hardness (HV)/complex elastic modulus (GPa) is 10 or more, the vanadium silicon nitride film 4 has sufficient hardness and oxidation resistance, and achieves both the hardness and the complex elastic modulus. Further, the value of Vickers hardness (HV)/complex elastic modulus (GPa) of the vanadium silicon nitride film 4 is further preferable to be 11 or more. Note that since the larger value of Vickers hardness (HV)/complex elastic modulus (GPa) is more preferable, an upper limit of Vickers hardness (HV)/complex elastic modulus (GPa) is not determined in particular, but it is 25, for example.

Further, when the plasma CVD method is used in formation of the vanadium nitride film 3 and the vanadium silicon nitride film 4 as in this embodiment, an apparatus equivalent to the film formation apparatus used in film formation processing of other than a complicated shape article can be used also in film formation processing for the complicated shape article. In other words, a film formation apparatus of special specifications for the film formation for the complicated shape article becomes unnecessary, thus enabling suppression of cost accompanying the introduction of the film formation apparatus. Further, even when both of the film formation apparatus of special specifications and the film formation apparatus of ordinary specifications are necessary in the conventional film formation method, the film formation apparatus of special specifications becomes unnecessary according to the film formation method of this embodiment, thus enabling reduction in the number of film formation apparatuses to be installed in a factory. This can increase a degree of freedom of the facility layout in the factory.

According to the film formation method of this embodiment, the vanadium chloride gas is used as the vanadium source gas at the time of formation of the vanadium nitride film 3 and at the time of formation of the vanadium silicon nitride film 4, so that the vanadium silicon nitride film 4 inevitably contains chlorine as impurities as a balance excluding vanadium, silicon and nitrogen therein. The hydrogen gas contained in the raw material gas is likely to combine with chlorine, so that when the hydrogen gas is contained as the raw material gas as in this embodiment, chlorine generated from the vanadium chloride gas combines with hydrogen and becomes likely to be discharged to the outside the system, enabling suppression of mixture of chlorine into the film of the vanadium silicon nitride film 4. Note that the balance of the vanadium silicon nitride film 4 may also contain inevitable impurities other than chlorine as in this embodiment.

A flow rate of the hydrogen gas during plasma processing is preferably 25 times or more a flow rate of the vanadium chloride gas. Further, though the argon gas is contained in the raw material gas in this embodiment, supply of the argon gas is not essential. Argon ions of the argon gas ionize other molecules and thereby contribute to stabilization of plasma and improvement in ion density, and therefore the argon gas is preferably supplied as needed.

Further, though in this embodiment the vanadium silicon nitride film 4 is formed on the surface of the vanadium nitride film 3 after formation of the vanadium nitride film 3 on the surface of the base material 2, the vanadium silicon nitride film 4 may be formed directly on the surface of the base material 2. However, in order to improve adhesiveness between the base material 2 and the vanadium silicon nitride film 4, it is preferable to form the vanadium nitride film 3.

Though the embodiment of the present invention has been described hereinabove, the present invention is not limited to the example. It should be understood that various change examples and modification examples are readily apparent to those skilled in the art within the technical spirit as set forth in claims, and those should also belong to the technical scope of the present invention.

EXAMPLES

A vanadium silicon nitride film (VSiN film) is formed on a surface of a base material by using a plasma CVD method, and a hardness and oxidation resistance of the film are evaluated. Further, as a comparative example, a vanadium nitride film (VN film) is formed on a surface of a base material, and a hardness and oxidation resistance of the film are evaluated. Note that in the following explanation, flow rates of a hydrogen gas, a nitrogen gas, an argon gas, a vanadium tetrachloride gas and a silicon tetrachloride gas are volume flow rates at 0° C. and 1 atm.

As the base material on which each hard film is formed, the one is used which is obtained by performing quenching and tempering treatments on a round bar of $\phi 22$ composed of SKD11 being one kind of die steel and then cutting the round bar at an interval of 6 to 7 mm, and performing mirror polishing on a surface of each cut member. Note that each hard film is formed on a surface on the side subjected to the mirror polishing of the base material. A film formation apparatus having a structure illustrated in FIG. 1 is used, and a pulse power supply is used as a power supply.

Here, a method for manufacturing a test piece of Example 1 will be described. Processing conditions of each step are as listed in Table 1 below.

TABLE 1

PROCESSING CONDITIONS (EXAMPLE 1)

| | STEP | | | | | | | |
|---|---|---|---|---|---|---|---|---|
| | EVACUATION | BAKING | COOLING | HEATING BY HEATER | $H_2$ PLASMA | $H_2 + N_2 + Ar$ PLASMA | VN FILM FORMATION | VSiN FILM FORMATION |
| SET TEMPERATURE OF HEATER (° C.) | HEATER TURNED OFF | 200 | HEATER TURNED OFF | 485 | 485 | 485 | 485 | 485 |
| PRESSURE (Pa) | UP TO 10 Pa | NOT CONTROLLED | NOT CONTROLLED | 100 | 100 | 58 | 58 | 58 |
| $H_2$ FLOW RATE (ml/min) | 0 | 5 | 5 | 100 | 100 | 200 | 200 | 200 |
| $N_2$ FLOW RATE (ml/min) | 0 | 0 | 0 | 0 | 0 | 50 | 50 | 75 |
| $VCl_4$ FLOW RATE (sccm) | 0 | 0 | 0 | 0 | 0 | 0 | 4.4 | 4.4 |
| $SiCl_4$ FLOW RATE (sccm) | 0 | 0 | 0 | 0 | 0 | 0 | 0 | 5.1 |
| Ar FLOW RATE (ml/min) | 0 | 0 | 0 | 0 | 0 | 5 | 5 | 5 |
| VOLTAGE OF PULSE POWER SUPPLY (V) | 0 | 0 | 0 | 0 | 800 | 1100 | 1500 | 1500 |
| FREQUENCY OF PULSE POWER SUPPLY (kHz) | 0 | 0 | 0 | 0 | 25 | 25 | 25 | 25 |
| DUTY RATIO (%) | 0 | 0 | 0 | 0 | 30 | 30 | 30 | 30 |
| OUTPUT FORM | 0 | 0 | 0 | 0 | UNIPOLAR | UNIPOLAR | UNIPOLAR | UNIPOLAR |
| PROCESSING TIME (min) | 30 | 10 | 30 | 30 | 20 | 20 | 30 | 120 |

<Film Formation Processing Preparation>

First of all, the base material is set in a chamber of the film formation apparatus and evacuation of the chamber is performed for 30 minutes so that the pressure in the chamber becomes, for example, as low as 10 Pa or less. In this event, a heater is not operated. Note that the heater is provided in the chamber and an atmospheric temperature in the chamber is measured with a sheathed thermocouple. Subsequently, with a temperature of the heater set to 200° C., a baking treatment is performed on the base material for 10 minutes. Thereafter, the heater is turned off, and the film formation apparatus is let stand for 30 minutes to cool the inside of the chamber.

<Heating Step>

Next, a hydrogen gas is supplied into the chamber at a flow rate of 100 ml/min, and an exhaust rate is adjusted to make the pressure in the chamber be 100 Pa. With the temperature of the heater set to 485° C., the base material is heated for 30 minutes. By this heating step, a temperature of the base material is raised up to near a plasma processing temperature.

<Plasma Processing Step>

Next, the pulse power supply is operated at a voltage: 800 V, a frequency: 25 kHz, a Duty ratio: 30%, and a unipolar output form. This converts the hydrogen gas into plasma between electrodes in the chamber. Thereafter, the flow rate of the hydrogen gas is increased to 200 ml/min and the nitrogen gas and the argon gas are supplied into the chamber. Then, the voltage of the pulse power supply is raised to 1100 V. This makes the hydrogen gas, the nitrogen gas, and the argon gas into a plasma state between the electrodes. Note that the flow rate of the nitrogen gas in this event is set to 50 ml/min and the flow rate of the argon gas is set to 5 ml/min. Further, the exhaust rate is adjusted to set the pressure in the chamber to 58 Pa.

Subsequently, the vanadium tetrachloride gas is supplied into the chamber at a flow rate of 4.4 sccm and the voltage of the pulse power supply is raised to 1500 V. This decomposes the vanadium tetrachloride gas into vanadium and chlorine. Then, vanadium and nitrogen converted into plasma adhere to the base material, whereby a vanadium nitride film which contributes to improvement of adhesiveness between the base material and the vanadium silicon nitride film is formed on the surface of the base material. This state is maintained for 30 minutes to thereby form vanadium nitride of 0.4 μm on the surface of the base material.

Subsequently, the silicon tetrachloride gas is supplied into the chamber at a flow rate of 5.1 sccm. This decomposes the silicon tetrachloride gas into silicon and chlorine. Further, the flow rate of the nitrogen gas is set to 75 ml/min. Then, silicon converted into plasma, vanadium being continuously supplied from the previous step, and nitrogen whose supply amount is increased compared with that of the previous step adhere to the base material, whereby a vanadium silicon nitride film is formed on a surface of the vanadium nitride film. This state is maintained for 120 minutes.

Through the above steps, the test piece of Example 1 coated with the vanadium silicon nitride film is obtained. On the other hand, processing conditions of each step for manufacturing a test piece of Comparative Example 1 are listed in Table 2 below.

TABLE 2

PROCESSING CONDITIONS (COMPARATIVE EXAMPLE 1)

| | \multicolumn{7}{c}{STEP} | | | | | | |
|---|---|---|---|---|---|---|---|
| | EVACUATION | BAKING | COOLING | HEATING BY HEATER | $H_2$ PLASMA | $H_2 + N_2 + Ar$ PLASMA | VN FILM FORMATION |
| SET TEMPERATURE OF HEATER (° C.) | HEATER TURNED OFF | 200 | HEATER TURNED OFF | 485 | 485 | 485 | 485 |
| PRESSURE (Pa) | UP TO 10 Pa | NOT CONTROLLED | NOT CONTROLLED | 100 | 100 | 58 | 58 |
| $H_2$ FLOW RATE (ml/min) | 0 | 5 | 5 | 100 | 100 | 200 | 200 |
| $N_2$ FLOW RATE (ml/min) | 0 | 0 | 0 | 0 | 0 | 50 | 50 |
| $VCl_4$ FLOW RATE (sccm) | 0 | 0 | 0 | 0 | 0 | 0 | 5.1 |
| $SiCl_4$ FLOW RATE (sccm) | 0 | 0 | 0 | 0 | 0 | 0 | 0 |
| Ar FLOW RATE (ml/min) | 0 | 0 | 0 | 0 | 0 | 5 | 5 |
| VOLTAGE OF PULSE POWER SUPPLY (V) | 0 | 0 | 0 | 0 | 800 | 1100 | 1500 |
| FREQUENCY OF PULSE POWER SUPPLY (kHz) | 0 | 0 | 0 | 0 | 25 | 25 | 25 |
| DUTY RATIO (%) | 0 | 0 | 0 | 0 | 30 | 30 | 30 |
| OUTPUT FORM | 0 | 0 | 0 | 0 | UNIPOLAR | UNIPOLAR | UNIPOLAR |
| PROCESSING TIME (min) | 30 | 10 | 30 | 30 | 20 | 20 | 180 |

The processing conditions of Comparative Example 1 are different from those of Example 1 only in that a film formation step of a vanadium silicon nitride film does not exist and that there are differences in flow rate of a vanadium tetrachloride gas and film formation processing time at a film formation step of a vanadium nitride film.

<Hardness Measurement>

On each of the test pieces obtained by the above film formation processing, hardness measurement is performed. Besides, for the purpose of oxidation resistance evaluation, soaking of each test piece is performed at 600° C. for one hour under an air atmosphere, and the hardness of each test piece after the soaking is measured again. Then, the hardness before the soaking is compared with the hardness after the soaking, thereby enabling evaluation of the oxidation resistance of the vanadium silicon nitride film from a degree of decrease in hardness after the soaking. Note that the hardness measurement is performed by a nano-indentation method using FISCHER SCOPE (registered trademark) HM2000 manufactured by Fischer Instruments. Specifically, a Vickers indenter is pushed into each test piece with a maximum indentation load set to 10 mN, and an indentation depth is continuously measured. Based on the obtained measurement data of the indentation depth, by using "brand name: WIN-HCU (registered trademark)" being software manufactured by Fischer Instruments, a Martens hardness, a Vickers hardness converted from the Martens hardness, and a complex elastic modulus are calculated. The calculated Vickers hardness is displayed on a screen of the measuring device, and the numerical value is used as a hardness of the film at a measurement point. In this example, the Vickers hardnesses at arbitrary 20 points on the surface of each test piece are obtained, and an average value of the obtained hardnesses is recorded as the hardness of the film.

Note that in pushing the indenter into the test piece, an indentation load propagates to a depth of about 10 times the maximum indentation depth of the indenter in some cases. Therefore, once the propagation of the indentation load reaches the base material of the test piece, the influence of the base material may be included in the result of the hardness measurement. Accordingly, for measuring the real hardness of the hard film, it is necessary to satisfy "film thickness of hard film>maximum indentation depth of indenter×10".

<Film Thickness Measurement>

Hence, whether the influence of the base material is included in the measured hardness of the vanadium silicon nitride film is evaluated also in this example. A film thickness of the vanadium silicon nitride film is measured by vertically cutting the test piece and subjecting a cut surface to mirror polishing, then observing the cut surface under a metallurgical microscope set at 1000-fold magnification, and performing calculation based on observed image information.

<Measurement Result 1—Evaluation of Oxidation Resistance of Vanadium Silicon Nitride Film and Vanadium Nitride Film>

As a result of measurement of the hardness of each test piece of Example 1 and Comparative Example 1, the hardness of the test piece of Example 1 at a film formation processing time is 3022 HV, while the hardness of the test piece of Comparative Example 1 at a film formation processing time is 2989 HV. In short, the test pieces of both Example 1 and Comparative Example 1 have the sufficient film hardness at the film formation processing time. On the other hand, the hardness is measured again after performing soaking of each test piece under conditions of 600° C. for one hour under an air atmosphere for the purpose of evaluation of oxidation resistance, and the hardness of the test piece of Example 1 after soaking is 2700 HV while the hardness of the test piece of Comparative Example 1 after soaking is 200 HV, indicating a decrease in hardness. In other words, the vanadium silicon nitride film of Example 1 has a sufficient hardness even after soaking and is a film excellent in oxidation resistance. Note that in both Example 1 and Comparative Example 1, the film thickness in relation to the maximum indentation depth of the indenter at a hardness measurement time is sufficient and the influence of the base material is not included in the result of the hardness measurement.

As shown by the above results, formation of the vanadium silicon nitride film on the surface of the base material enables suppression of a decrease in film hardness due to oxidation.

Next, in order to evaluate characteristics of the vanadium silicon nitride film formed under different conditions of the film formation processing, there are prepared, other than the test piece of Example 1, a plurality of test pieces of Examples 2 to 4 in which processing conditions at a time of starting supplying a silicon tetrachloride gas are changed and a plurality of test pieces in which vanadium silicon nitride films are formed under conditions of film formation processing of Comparative Examples 2 to 5. The conditions of film formation processing of each test piece are listed in Table 3 below. Note that the processing conditions until start of film formation of the vanadium silicon nitride film are the same as the processing conditions of Example 1. Further, a "partial pressure ratio" in Table 3 is a partial pressure ratio of each gas which is calculated with the partial pressure ratio of the hydrogen gas being set to 100.

TABLE 3

| | | | EXAMPLE 1 | EXAMPLE 2 | EXAMPLE 3 | EXAMPLE 4 | COMPARATIVE EXAMPLE 2 | COMPARATIVE EXAMPLE 3 | COMPARATIVE EXAMPLE 4 | COMPARATIVE EXAMPLE 5 |
|---|---|---|---|---|---|---|---|---|---|---|
| FILM FORMATION CONDITONS FOR VSiN FILM | TEMPERATURE OF HEATER (° C.) | | 485 | 485 | 485 | 485 | 485 | 485 | 485 | 485 |
| | PRESSURE (Pa) | | 58 | 58 | 58 | 58 | 58 | 59 | 58 | 59 |
| | $H_2$ | FLOW RATE (ml/min) | 200 | 200 | 200 | 183 | 200 | 200 | 200 | 200 |
| | | PARTIAL PRESSURE RATIO | 100 | 100 | 100 | 100 | 100 | 100 | 100 | 100 |
| | $N_2$ | FLOW RATE (ml/min) | 75 | 50 | 100 | 100 | 50 | 50 | 50 | 125 |
| | | PARTIAL PRESSURE RATIO | 37.5 | 25 | 50 | 54.6 | 25 | 25 | 25 | 62.5 |
| | $VCl_2$ | FLOW RATE (sccm) | 4.4 | 4.5 | 4.4 | 4.4 | 4.3 | 4.3 | 4.4 | 4.4 |
| | | PARTIAL PRESSURE RATIO | 2.2 | 2.3 | 2.2 | 2.4 | 2.2 | 2.2 | 2.2 | 2.2 |
| | $SiCl_4$ | FLOW RATE (sccm) | 5.1 | 5.0 | 5.0 | 5.1 | 5.2 | 5.0 | 8.2 | 5.1 |
| | | PARTIAL PRESSURE RATIO | 2.6 | 2.5 | 2.5 | 2.8 | 2.6 | 2.5 | 4.1 | 2.6 |
| | Ar | FLOW RATE (ml/min) | 5 | 5 | 5 | 22 | 5 | 5 | 5 | 5 |
| | | PARTIAL PRESSURE RATIO | 2.5 | 2.5 | 2.5 | 12.0 | 2.5 | 2.5 | 2.5 | 2.5 |
| | VOLTAGE OF PULSE POWER SUPPLY (V) | | 1500 | 1500 | 1500 | 1500 | 1400 | 1500 | 1500 | 1500 |
| | FREQUENCY OF PULSE POWER SUPPLY (kHz) | | 25 | 25 | 25 | 25 | 25 | 25 | 25 | 25 |
| | DUTY RATIO (%) | | 30 | 50 | 30 | 30 | 40 | 30 | 30 | 30 |
| | OUTPUT FORM | | UNIPOLAR | UNIPOLAR | UNIPOLAR | UNIPOLAR | UNIPOLAR | UNIPOLAR | UNIPOLAR | UNIPOLAR |
| | PROCESSING TIME (min) | | 120 | 120 | 120 | 120 | 120 | 120 | 120 | 120 |

<Composition Analysis of Vanadium Silicon Nitride Film>

Next, a composition of the vanadium silicon nitride film of each test piece is analyzed. Analysis conditions are as follows.

EPMA: JXA-8530F manufactured by JEOL Ltd.
Measurement mode: semiquantitative analysis
Acceleration voltage: 15 kV
Irradiation current: $1.0 \times 10^{-7}$ A
Beam shape: spot
Beam diameter set value: 0
Dispersive crystal: LDE6H, TAP, LDE5H, PETH, LIFH, LDE1H Note that when the film thickness of the vanadium silicon nitride film is 1 μm or less, a composition of components of the base material and other films influence a measurement result of EPMA. Therefore, in the case of measuring the composition of the vanadium silicon nitride film having a small film thickness, it is necessary to perform EPMA measurement in advance on the test piece prior to formation of the vanadium silicon nitride film and subtract a vanadium element concentration [at %], a silicon element concentration [at %] and a nitrogen element concentration [at %] derived from the base material and other films from the measurement result of EPMA after the formation of the vanadium silicon nitride film. For example, when a vanadium silicon nitride film of 1 μm or less is formed on a surface of a base material containing vanadium, a vanadium element concentration [at %] of the vanadium silicon nitride film can be found from a formula (2) below by using a vanadium element concentration [at %] of the base material which is calculated from a formula (1) below. Note that by calculating similarly as for silicon and nitrogen contained in the base material, it is possible to find a silicon element concentration [at %] and a nitrogen element concentration [at %] of the vanadium silicon nitride film.

vanadium element concentration of base material [at %]=(vanadium element concentration measured by EPMA before formation of vanadium silicon nitride film [at %]/iron element concentration measured by EPMA before formation of vanadium silicon nitride film [at %])×iron element concentration measured by EPMA after formation of vanadium silicon nitride film [at %]  (1)

vanadium element concentration of vanadium silicon nitride film [at %]=vanadium element concentration measured by EPMA after formation of vanadium silicon nitride film [at %]−vanadium element concentration of base material [at %]  (2)

<Measurement Result 2—Characteristic Evaluation of Each Vanadium Silicon Nitride Film>

Table 4 below lists a Vickers hardness, a film thickness, and a composition of each test piece in which the vanadium silicon nitride film is formed. Note that "balance" in Table 4 indicates a total amount of impurities such as chlorine and carbon.

under conditions of 900° C. for one hour under an air atmosphere for the purpose of evaluation of oxidation resistance, the hardness of the test piece of Comparative Example 2 after soaking is 40 HV. As described above, the hardness of the test piece of Example 1 at the time of film formation processing is 3022 HV and the hardness after soaking is 2700 HV, which indicates that the vanadium silicon nitride film formed in Example 1 is improved compared with the vanadium silicon nitride film of Comparative Example 2 in oxidation resistance. Note that when soaking under the same conditions for Comparative Example 2 is performed on the test piece of Example 2, the hardness after soaking is 2616 HV while the hardness before soaking is 2782 HV. In other words, the vanadium silicon nitride film of Example 2 is also excellent in oxidation resistance.

Then, the test pieces of Example 1 and Comparative Example 2 are vertically cut and element mapping is performed on their cut surfaces, and regarding the test piece of Example 1 a film made of vanadium, silicon and nitrogen is identified. On the other hand, regarding the test piece of Comparative Example 2, a film containing vanadium and silicon is not identified and it is confirmed that an oxide film of iron or chromium has grown. As listed in Table 4, the vanadium silicon nitride film of Example 1 and the vanadium silicon nitride film of Comparative Example 2 are different in silicon element concentration, and the difference in silicon element concentration is considered to influence a film property after soaking. According to a result of this example, it is found that increasing the silicon element concentration in the vanadium silicon nitride film enables improvement of oxidation resistance of the vanadium silicon nitride film.

Further, the test pieces of Examples 1 to 4 have a hardness of 2300 HV or more, and vanadium silicon nitride formed on the surface of the test piece has a sufficient hardness as a

TABLE 4

| | | EXAMPLE 1 | EXAMPLE 2 | EXAMPLE 3 | EXAMPLE 4 | COMPARATIVE EXAMPLE 2 | COMPARATIVE EXAMPLE 3 | COMPARATIVE EXAMPLE 4 | COMPARATIVE EXAMPLE 5 |
|---|---|---|---|---|---|---|---|---|---|
| HARDNESS OF VSiN FILM (HV) | | 3022 | 2782 | 2607 | 2533 | 2977 | 1597 | 1514 | 2180 |
| COMPLEX ELASTIC MODULUS OF VSiN FILM (GPa) | | 243 | 234 | 215 | 237 | 277 | 182 | 172 | 181 |
| HARDNESS (HV)/COMPLEX ELASTIC MODULUS | | 12.4 | 11.9 | 12.1 | 10.7 | 10.7 | 8.8 | 8.8 | 12.1 |
| FILM THICKNESS OF VSiN FILM (μm) | | 1.9 | 2.4 | 1.5 | 2.3 | 2.0 | 2.7 | 2.6 | 1.7 |
| MAXIMUM INDENTATION DEPTH AT HARDNESS MEASUREMENT TIME (μm) | | 0.13 | 0.13 | 0.13 | 0.13 | 0.11 | 0.16 | 0.17 | 0.15 |
| COMPOSITION OF VSiN FILM | V (at %) | 26.5 | 36.2 | 16.8 | 35.0 | 51.7 | 42.2 | 41.9 | 9.0 |
| | Si (at %) | 23.4 | 30.1 | 28.7 | 24.1 | 8.7 | 17.4 | 20.2 | 35.7 |
| | N (at %) | 45.2 | 27.9 | 46.5 | 34.7 | 35.2 | 35.3 | 32.8 | 47.0 |
| | BALANCE (at %) | 4.84 | 5.78 | 8.03 | 6.25 | 4.37 | 5.17 | 5.07 | 8.29 |
| a = V/(V + Si + N) | | 0.279 | 0.384 | 0.182 | 0.373 | 0.540 | 0.445 | 0.441 | 0.098 |
| b = Si/(V + Si + N) | | 0.246 | 0.320 | 0.312 | 0.257 | 0.091 | 0.183 | 0.213 | 0.389 |
| N/(V + Si + N) | | 0.475 | 0.296 | 0.505 | 0.370 | 0.368 | 0.372 | 0.346 | 0.513 |
| a/b | | 1.13 | 1.20 | 0.58 | 1.45 | 5.91 | 2.43 | 2.07 | 0.25 |

First of all, the hardness of the test piece of Comparative Example 2 is 2977 HV, and the vanadium silicon nitride film of Comparative example 2 has a sufficient film hardness at a time of film formation processing. However, when soaking is performed on the test piece of Comparative Example 2 hard film. On the other hand, a hardness of test pieces of Comparative Examples 3 to 5 is lower than 2300 HV. Though much silicon is preferable to be contained in the film in view of oxidation resistance, too much silicon as in Comparative Example 5 induces a decrease in hardness in some cases. According to the results in Table 4, for achievement of both the hardness and the oxidation resistance, a composition of vanadium, silicon and nitride is required to be within a certain range. Further, in order to secure slidability of the vanadium silicon nitride film, it is also necessary to secure a certain amount of vanadium.

Hence, a composition ratio of the above-described three elements in each test piece is calculated. More specifically, with vanadium element concentration [at %]/(vanadium element concentration [at %]+silicon element concentration [at %]+nitrogen element concentration [at %]) being indicated as "a" and silicon element concentration [at %]/(vanadium element concentration [at %]+silicon element concentration [at %]+nitrogen element concentration [at %]) being indicated as "b", each value of "a" and "b" is calculated. Besides, a value of a/b is also calculated. Results thereof are as listed in Table 4, and as indicted by Comparative Examples 3, 4, a sufficient film hardness cannot be obtained when the value of a/b is too large. Further, as indicated by Comparative Example 5, a sufficient film hardness cannot be obtained also in the case where the value of a/b is too small.

According to the result of this example, a sufficient film hardness can be obtained when the value of a/b is 0.30 or more and 1.7 or less. Further, according to the results in Table 4, it is considered that the value of "b" is required to be 0.24 or more and 0.36 or less in order for the vanadium silicon nitride film to have a sufficient film hardness. In Examples 1 to 4 in which such a vanadium silicon nitride film is formed, a ratio of partial pressures of a hydrogen gas, a nitrogen gas, a vanadium chloride gas, a silane source gas, and an argon gas at the time of formation of the vanadium silicon nitride film satisfies $\{100\}:\{(61.25-0.875\times x)$ to $(86.25-0.875\times x)\}:\{(0.25+0.025\times x)$ to $(3.25+0.025\times x)\}:\{(3.5-0.04\times x)$ to $(6.2-0.04\times x)\}:\{(0.5$ to $15)\}$, when a Duty ratio is indicated as x ($10 \leq x \leq 65$). Note that an upper limit and a lower limit of the ratio of partial pressures of respective gases in the case of Duty ratio of 30, 40, and 50 are listed in Table 5 below.

TABLE 5

| DUTY RATIO (%) | KIND OF GAS | PARTIAL PRESSURE RATIO | |
|---|---|---|---|
| | | LOWER LIMIT | UPPER LIMIT |
| 30 | $N_2$ | 35 | 60 |
| | $VCl_4$ | 1 | 4 |
| | $SiCl_4$ | 2.3 | 5 |
| | Ar | 0.5 | 15 |
| 40 | $N_2$ | 26.25 | 51.25 |
| | $VCl_4$ | 1.25 | 4.25 |
| | $SiCl_4$ | 1.9 | 4.6 |
| | Ar | 0.5 | 15 |
| 50 | $N_2$ | 17.5 | 42.5 |
| | $VCl_4$ | 1.5 | 4.5 |
| | $SiCl_4$ | 1.5 | 4.2 |
| | Ar | 0.5 | 15 |

On the other hand, in Comparative Examples 2 to 5, a ratio of partial pressures of a hydrogen gas, a nitrogen gas, a vanadium chloride gas, a silane source gas and an argon gas at the time of formation of the vanadium silicon nitride film does not satisfy $\{100\}:\{(61.25-0.875\times x)$ to $(86.25-0.875\times x)\}:\{(0.25+0.025\times x)$ to $(3.25+0.025\times x)\}:\{(3.5-0.04\times x)$ to $(6.2-0.04\times x)\}:\{(0.5$ to $15)\}$, when a Duty ratio is indicated as x ($10 \leq x \leq 65$). More specifically, the ratio of the partial pressure of the nitrogen gas is out of a range of a numeric value calculated from the above formula. Accordingly, in forming a vanadium silicon nitride film, when a hydrogen gas, a nitrogen gas, a vanadium chloride gas, a silane source gas and an argon gas are supplied, it is not possible to obtain the vanadium silicon nitride film as in Examples 1 to 4 unless a ratio of partial pressures is not set to satisfy the above formula.

Further, the vanadium silicon nitride film of Examples 1 to 4 have a hardness of 2300 HV or more and a complex elastic modulus of 250 GPa or less, and achieve both the hardness and the complex elastic modulus at high levels. In other words, the test pieces of Examples 1 to 4 have a wider elastically deformed region of the film, so that higher abrasion resistance can be expected compared with a hard film having the same level of hardness. Moreover, values of Vickers hardness (HV)/complex elastic hardness (GPa) of the vanadium silicon nitride films of Examples 1 to 4 are all 10 or more, that is, these are films which achieve both the hardness and the complex elastic modulus. In other words, the vanadium silicon nitride films of Examples 1 to 4 are films achieving both the hardness and the complex elastic modulus and further having the sufficient hardness and oxidation resistance, and hence are hard films superior to the vanadium silicon nitride films of Comparative Examples 2 to 5.

Note that a thickness of the vanadium silicon nitride film of each test piece listed in Table 4 is a thickness significantly beyond 10 times the maximum indentation depth of the indenter at the hardness measurement time, and hence the numeric value of the hardness of the vanadium silicon nitride film listed in Table 4 is not influenced by the base material and the vanadium nitride film which is formed between the base material and the vanadium silicon nitride film. In other words, the hardness of the vanadium silicon nitride film listed in Table 4 is a hardness of the vanadium silicon nitride film itself.

INDUSTRIAL APPLICABILITY

The present invention is applicable to a hard film treatment of a mold, a tool and so on.

EXPLANATION OF CODES

1 member coated with a vanadium silicon nitride film
2 base material
3 vanadium nitride film
4 vanadium silicon nitride film
10 plasma processing apparatus
11 chamber
12 anode
13 cathode
14 pulse power supply
15 gas supply pipe
16 gas exhaust pipe

The invention claimed is:

1. A vanadium silicon nitride film formed as a hard film to a base material, wherein the vanadium silicon nitride film satisfies $$0.30 \leq a/b \leq 1.7 \text{ and } 0.24 \leq b \leq 0.36$$

when
a=vanadium element concentration[at %]/(vanadium element concentration [at %]+silicon element concentration [at %]+nitrogen element concentration[at %]) and b=silicon element concentration[at %]/(vanadium element concentration[at %]+silicon element concentration [at %]+nitrogen element concentration[at %]), and has a hardness of 2300 HV or more.

2. A member coated with a vanadium silicon nitride film in which a base material is coated with the vanadium silicon nitride film, wherein the vanadium silicon nitride film satisfies $0.30 \leq a/b \leq 1.7$ and $0.24 \leq b \leq 0.36$ when a=vanadium element concentration[at %]/(vanadium element concentration [at %]+silicon element concentration [at %]+nitrogen element concentration[at %]) and b=silicon element concentration[at %]/(vanadium element concentration [at %]+silicon element concentration [at %]+nitrogen element concentration[at %]), and has a hardness of 2300 HV or more.

3. A method for manufacturing a member coated with a vanadium silicon nitride film in which a base material is coated with the vanadium silicon nitride film, the method comprising:

in forming the vanadium silicon nitride film, supplying a raw material gas containing a nitrogen source gas constituted with one or more gases selected from a group of a nitrogen gas and an ammonia gas, a vanadium chloride gas, a silane source gas constituted with one or more gases selected from a group of a silicon tetrachloride gas, a silane trichloride gas, a silane dichloride gas, a silane chloride gas, silane and silicon tetrafluoride, and a hydrogen gas; and performing plasma chemical vapor deposition to form the vanadium silicon nitride film which satisfies $0.30 \leq a/b \leq 1.7$ and $0.24 \leq b \leq 0.36$ when a=vanadium element concentration [at %]/(vanadium element concentration [at %]+silicon element concentration [at %]+nitrogen element concentration[at %]) and b=silicon element concentration[at %]/(vanadium element concentration[at %]+silicon element concentration[at %]+nitrogen element concentration[at %]), and has a hardness of 2300 HV or more.

4. The method for manufacturing the member coated with the vanadium silicon nitride film according to claim 3, wherein the nitrogen source gas is the nitrogen gas.

5. The method for manufacturing the member coated with the vanadium silicon nitride film according to claim 3, wherein the vanadium chloride gas is a vanadium tetrachloride gas.

6. The method for manufacturing the member coated with the vanadium silicon nitride film according to claim 3, wherein the silane source gas is the silicon tetrachloride gas.

7. A method for manufacturing the member coated with the vanadium silicon nitride film in which the base material is coated with the vanadium silicon nitride film of claim 2, the method comprising:

in forming the vanadium silicon nitride film by plasma chemical vapor deposition, supplying a hydrogen gas, a nitrogen gas, a vanadium chloride gas, a silane source gas and an argon gas; and setting a ratio of partial pressures of the hydrogen gas, the nitrogen gas, the vanadium chloride gas, the silane source gas and the argon gas to $\{100\}:\{(61.25-0.875\times x)$ to $(86.25-0.875\times x)\}:\{(0.25+0.025\times x)$ to $(3.25+0.025\times x)\}:\{(3.5-0.04\times x)$ to $(6.2-0.04\times x)\}:\{(0.5$ to $15)\}$, when a Duty ratio is indicated as x ($10 \leq x \leq 65$), to form the vanadium silicon nitride film.

8. The method for manufacturing the member coated with the vanadium silicon nitride film according to claim 7, wherein the silane source gas is a silicon tetrachloride gas.

* * * * *